United States Patent
Moh et al.

(10) Patent No.: US 10,095,075 B2
(45) Date of Patent: Oct. 9, 2018

(54) DISPLAY PANEL, DISPLAY APPARATUS HAVING THE SAME AND METHOD OF MANUFACTURING THE SAME

(71) Applicant: Samsung Display Co., Ltd, Yongin-si, Gyeonggi-do (KR)

(72) Inventors: Sang-Moon Moh, Hwaseong-si (KR); Luck-Hyun Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 8 days.

(21) Appl. No.: 15/459,347

(22) Filed: Mar. 15, 2017

(65) Prior Publication Data

US 2017/0184904 A1  Jun. 29, 2017

Related U.S. Application Data

(62) Division of application No. 14/460,133, filed on Aug. 14, 2014, now Pat. No. 9,634,034.

(30) Foreign Application Priority Data

Jan. 2, 2014  (KR) .................. 10-2014-0000327

(51) Int. Cl.
  *G02F 1/1345*  (2006.01)
  *G02F 1/1362*  (2006.01)
  (Continued)

(52) U.S. Cl.
  CPC ...... *G02F 1/13458* (2013.01); *G02F 1/13452* (2013.01); *G02F 1/136227* (2013.01); *G02F 1/136286* (2013.01); *G02F 1/1368* (2013.01); *G02F 1/133512* (2013.01); *G02F 1/133514* (2013.01); *G02F 2001/136295* (2013.01)

(58) Field of Classification Search
  CPC .................. G02F 1/12458; G02F 1/13452
  See application file for complete search history.

(56) References Cited

U.S. PATENT DOCUMENTS

| 6,297,868 B1 | 10/2001 | Takenaka et al. |
| 6,608,382 B2 | 8/2003 | Liu et al. |

(Continued)

FOREIGN PATENT DOCUMENTS

| JP | 2003-303852 | 10/2003 |
| JP | 2005-353882 | 12/2005 |

(Continued)

*Primary Examiner* — Tom Thomas
*Assistant Examiner* — John Bodnar
(74) *Attorney, Agent, or Firm* — Innovation Counsel LLP

(57) ABSTRACT

A display panel includes a display area configured to display an image, and a peripheral area adjacent to the display area. The peripheral area includes a pad area in which a plurality of output pads are disposed. The output pads are arranged in a matrix formed having M row*N column (M and N are normal numbers, M is 3 or larger than 3). Each of the output pads has a center of the output pad spaced apart from a center of an adjacent output pad by a distance D in a first direction. Each of the output pads is spaced apart from an adjacent output pad by a gap. Each of the output pads has a center of the output pad spaced apart from a center of an adjacent output pad by a pitch P in a second direction which is substantially perpendicular to the first direction. An equation "P<D/(M−1)" is satisfied.

5 Claims, 19 Drawing Sheets

(51) Int. Cl.
*G02F 1/1368* (2006.01)
*G02F 1/1335* (2006.01)

(56) References Cited

U.S. PATENT DOCUMENTS

| | | |
|---|---|---|
| 6,861,749 B2 | 3/2005 | Wu et al. |
| 7,224,424 B2 | 5/2007 | Hwang et al. |
| 8,063,497 B2 | 11/2011 | Tang et al. |
| 2004/0165138 A1 | 8/2004 | Hwang |
| 2005/0077524 A1* | 4/2005 | Ahn ................ G02F 1/13458 257/72 |
| 2005/0157244 A1 | 7/2005 | Hwang |
| 2006/0183265 A1 | 8/2006 | Oh |
| 2007/0029658 A1* | 2/2007 | Peng ................ G02F 1/13452 257/680 |
| 2008/0090314 A1 | 4/2008 | Ichihara et al. |
| 2008/0251787 A1 | 10/2008 | Kim |
| 2009/0121349 A1 | 5/2009 | Suzuki |
| 2010/0117081 A1 | 5/2010 | Obuchi et al. |
| 2013/0106817 A1 | 5/2013 | Gang |
| 2013/0155345 A1* | 6/2013 | Ogasawara ......... G02F 1/13458 349/46 |

FOREIGN PATENT DOCUMENTS

| | | |
|---|---|---|
| JP | 2006-237364 | 9/2006 |
| JP | 2007-103439 | 4/2007 |
| JP | 2012-060029 | 3/2012 |
| JP | 2012-191015 | 10/2012 |
| KR | 1020060112521 A | 11/2006 |

\* cited by examiner

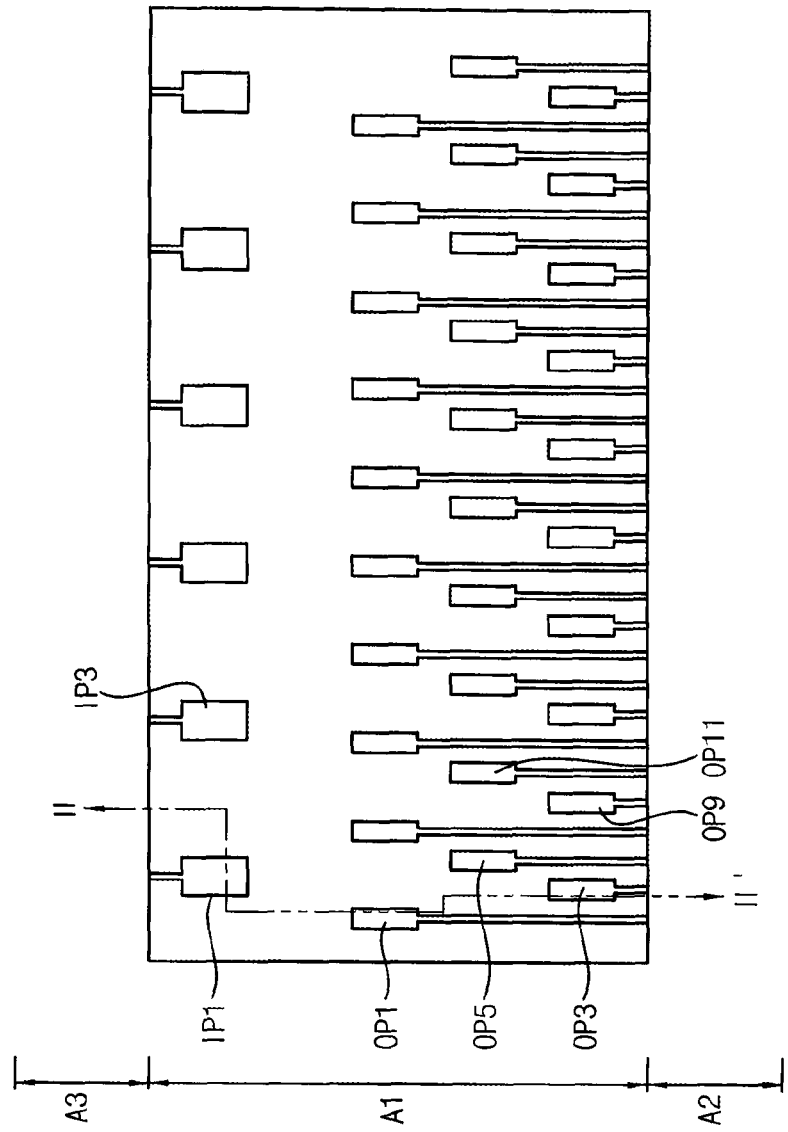

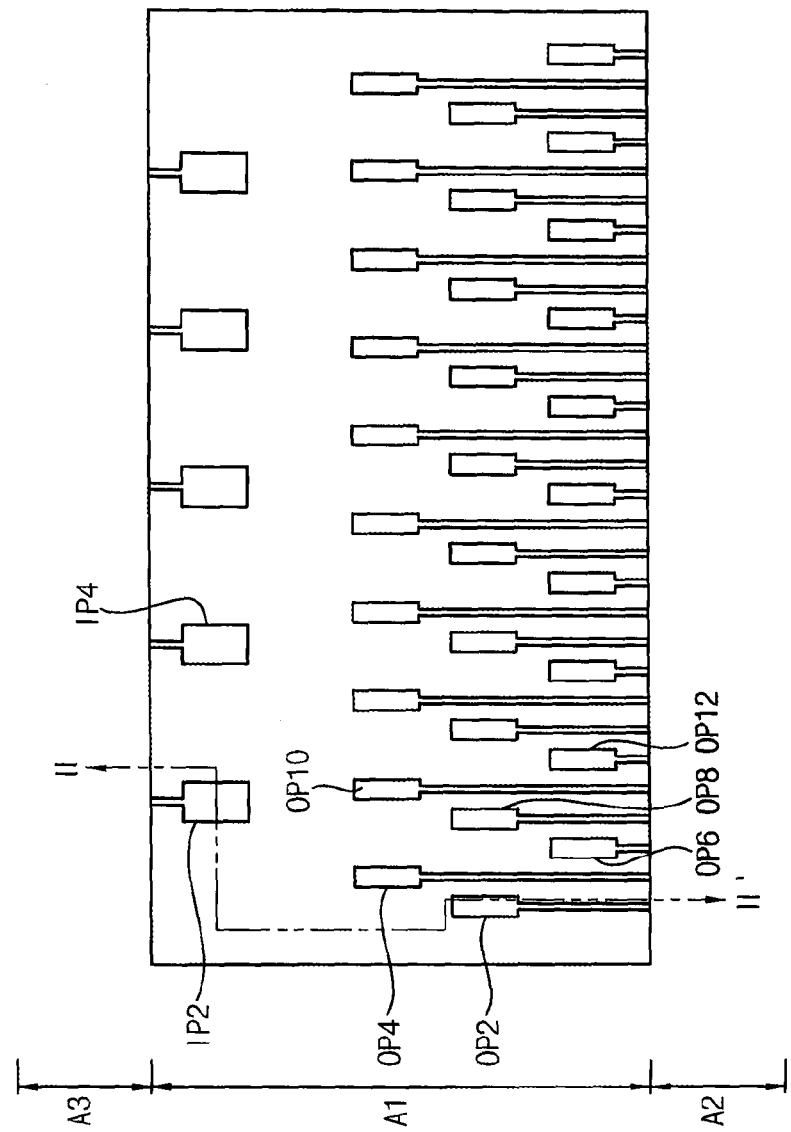

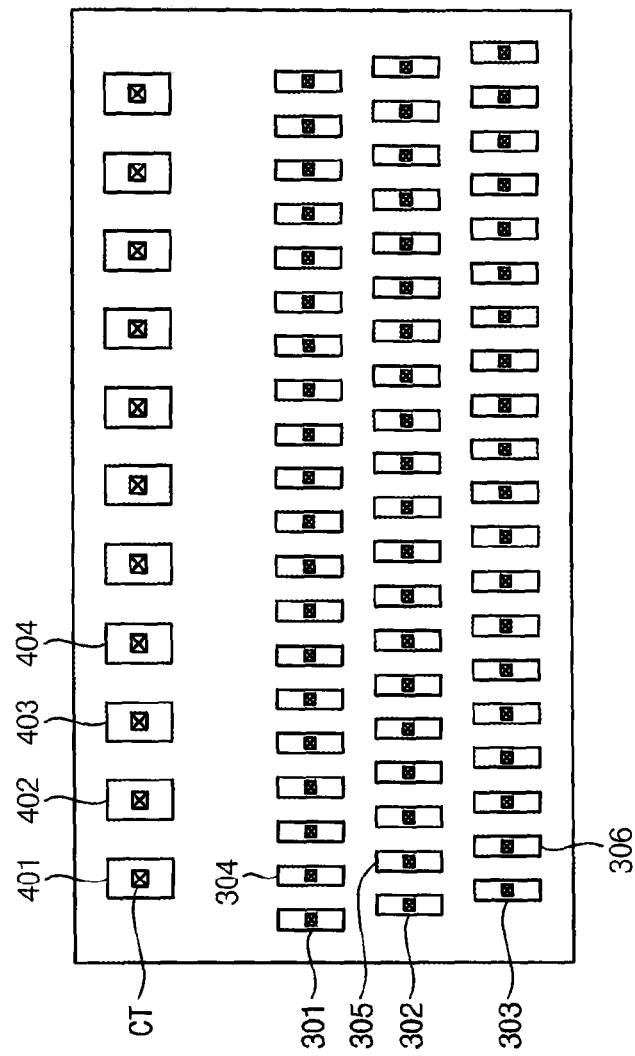

DISPLAY PANEL, DISPLAY APPARATUS HAVING THE SAME AND METHOD OF MANUFACTURING THE SAME

This application is a divisional application of U.S. patent application Ser. No. 14/460,133 filed on Aug. 14, 2014, which claims priority to Korean Patent Application No. 10-2014-0000327, filed on Jan. 2, 2014, and all the benefits accruing therefrom under 35 U.S.C. § 119, the contents of the prior applications being herein incorporated by reference.

BACKGROUND

1. Field

Exemplary embodiments of the inventive concept relate to a display panel, a display apparatus including the display panel, and a method of manufacturing the display panel.

More particularly, exemplary embodiments of the inventive concept relate to a display panel for a liquid crystal display apparatus, a display apparatus including the display panel, and a method of manufacturing the display panel.

2. Description of the Related Art

Recently, a display apparatus having light weight and small size has been manufactured. A cathode ray tube (CRT) display apparatus has been used due to a performance and a competitive price. However, the CRT display apparatus has a weakness with a size or portability. Therefore the liquid crystal display apparatus has been highly regarded due to small size, light weight and low-power-consumption of the liquid crystal display apparatus.

The liquid crystal display apparatus applies a voltage to specific molecular arrangement configured to change the molecular arrangement. The liquid crystal display apparatus displays an image using changes of optical property (for example, birefringence, rotatory polarization, dichroism and light scattering) of a liquid crystal cell according to the changes of the molecular arrangement.

The liquid crystal display apparatus includes a display panel and a driving part to apply a driving signal to the display panel. The display panel may have a COG (chip on glass) structure. When the driving chip is being mounted on the display panel, a resin of an anisotropic conductive film may not flow sufficiently, so that a falling of an electrical characteristic may be caused.

SUMMARY

One or more exemplary embodiment of the inventive concept provides a display panel capable of improving an electrical contacting characteristic between a driving chip and an output pad.

One or more exemplary embodiments of the inventive concept also provide a display apparatus including the display panel.

One or more exemplary embodiments of the inventive concept also provide a method of manufacturing the display panel.

According to an exemplary embodiment of the inventive concept, a display panel includes a display area configured to display an image, and a peripheral area adjacent to the display area. The peripheral area includes a pad area in which a plurality of output pads are disposed. The output pads are arranged in a matrix formed having M row*N column (M and N are normal numbers, M is 3 or larger than 3). Each of the output pads has a center of the output pad spaced apart from a center of an adjacent output pad by a distance D in a first direction. Each of the output pads is spaced apart from an adjacent output pad by a gap. Each of the output pads has a center of the output pad spaced apart from a center of an adjacent output pad by a pitch P in a second direction which is substantially perpendicular to the first direction. An equation "P<D/(M−1)" is satisfied.

In an exemplary embodiment, the display panel may further include a driving chip including a plurality of output bumps corresponding to the output pads, respectively, and an anisotropic conductive film between the output pads and the output bumps to electrically connect the output pads to the output bumps.

In an exemplary embodiment, the output pads may be disposed in bilateral symmetry with respect to a line. The line may pass a center of the pad area and extend in the second direction.

In an exemplary embodiment, each of the output pads may extend in the second direction, and may have a width in the first direction. Each of the output pads may include a first side having a first length and a second side having a second length. The second side may be in parallel with the first side. The second length may be smaller than the first length.

In an exemplary embodiment, each of the output pads may have a hexagonal shape.

In an exemplary embodiment, the output pads may be arranged in three rows (M=3). The distance D may be about 33 μm, and the pitch P is about 11 μm.

In an exemplary embodiment, the display panel may further include a base substrate, a first output pattern disposed on the base substrate, a first insulation layer disposed on the first base substrate on which the first output pattern is disposed, a second output pattern disposed on the first insulation layer, and a second insulation layer disposed on the first insulation layer on which the second output pattern is disposed. The output pads may be disposed on the second insulation layer. Each of the output pads may be electrically connected to the first or second output pattern through a contact hole formed through the first and second insulation layer.

In an exemplary embodiment, the output pads may include a transparent conductive material.

In an exemplary embodiment, a switching element and a pixel electrode electrically connected to the switching element may be disposed in the display area. The switching element may include a gate electrode disposed on the first base substrate, a channel portion overlapping the gate electrode, a source electrode disposed on the channel portion and a drain electrode spaced apart from the source electrode.

In an exemplary embodiment, the gate electrode and the first output pattern may be formed form a same layer. The source electrode, the drain electrode and the second output pattern may be formed from a same layer.

In an exemplary embodiment, the pixel electrode and the output pads are formed from a same layer.

In an exemplary embodiment, the first output pattern and the second output pattern may be alternately disposed.

In an exemplary embodiment, the peripheral area may further include an output fan-out area between the output pads and the display area. A plurality of output lines may be disposed in the output fan-out area. A width of the output lines may be expanded from the output pads to the display area.

According to an exemplary embodiment of the inventive concept, a display apparatus includes a display panel, and a receiving container receiving the display panel. The display panel includes a display area configured to display an image, and a peripheral area adjacent to the display area. The peripheral area includes a pad area in which a plurality of output pads are disposed. The output pads are arranged in a matrix formed having M row*N column (M and N are normal numbers, M is 3 or larger than 3). Each of the output pads has a center of the output pad spaced apart from a center of an adjacent output pad by a distance D in a first direction. Each of the output pads is spaced apart from an adjacent output pad by a gap. Each of the output pads has a center of the output pad spaced apart from a center of an adjacent output pad by a pitch P in a second direction which is substantially perpendicular to the first direction. An equation "$P<D/(M-1)$" is satisfied.

In an exemplary embodiment, the display apparatus may further include a driving part configured to generate an input signal, and a connecting part electrically connecting the display panel to the driving part. A plurality of input pads may be disposed in the pad area of the display panel. The connecting part may be electrically connected to the input pads and be configured to transmit the input signal from the driving part to the input pads.

According to an exemplary embodiment of the inventive concept, a method of manufacturing a display panel includes forming a circuit wiring and a plurality of output pads, and mounting a driving chip comprising output bumps on the output pads. The output pads are arranged in a matrix formed having M row*N column (M and N are normal numbers, M is 3 or larger than 3). Each of the output pads has a center of the output pad spaced apart from a center of an adjacent output pad by a distance D in a first direction. Each of the output pads is spaced apart from an adjacent output pad by a gap. Each of the output pads has a center of the output pad spaced apart from a center of an adjacent output pad by a pitch P in a second direction which is substantially perpendicular to the first direction. An equation "$P<D/(M-1)$" is satisfied.

In an exemplary embodiment, the method may further include providing an anisotropic conductive film on the output pads, and locating the driving chip on the anisotropic conductive film, and then pressing the driving chip to electrically connect the output bumps to the output pads.

In an exemplary embodiment, forming the circuit wiring and the output pads may include forming a gate pattern comprising a gate line, a gate electrode and a first output pattern, forming a first insulation layer on the gate pattern, and forming a pixel electrode and the output pads on the first insulation layer.

In an exemplary embodiment, forming the circuit wiring and the output pads further include, between forming the first insulation layer and forming the pixel electrode and the output pads, forming a data pattern on the first insulation layer, the data pattern comprising a data line, a source electrode and a drain electrode, and forming a second insulation layer on the data pattern.

In an exemplary embodiment, the first output pattern and the second output pattern may be alternately disposed in the first direction.

According to the present inventive concept, a display panel includes a pad area in which a plurality of output pads has a specific arrangement. Between adjacent two output pads in a first row, an output pad in other column and same row is disposed, so that a resin of an anisotropic conductive film may easily flow. Thus, conductive balls of the anisotropic conductive film may be uniformly dispersed over the pad area, so that a contacting characteristic between output and input bumps of a driving chip, the output and input pads and the conductive balls may be improved.

BRIEF DESCRIPTION OF THE DRAWINGS

The above and other features of the inventive concept will become more apparent by describing in detail exemplary embodiments thereof with reference to the accompanying drawings, in which:

FIGS. 10A, 10B, 11A, 11B, 12A, 12B, 13, 14 are plan views and cross-sectional views illustrating a method of manufacturing a display panel of FIG. 1;

DETAILED DESCRIPTION

Hereinafter, the inventive concept will be explained in detail with reference to the accompanying drawings.

Figure 1:
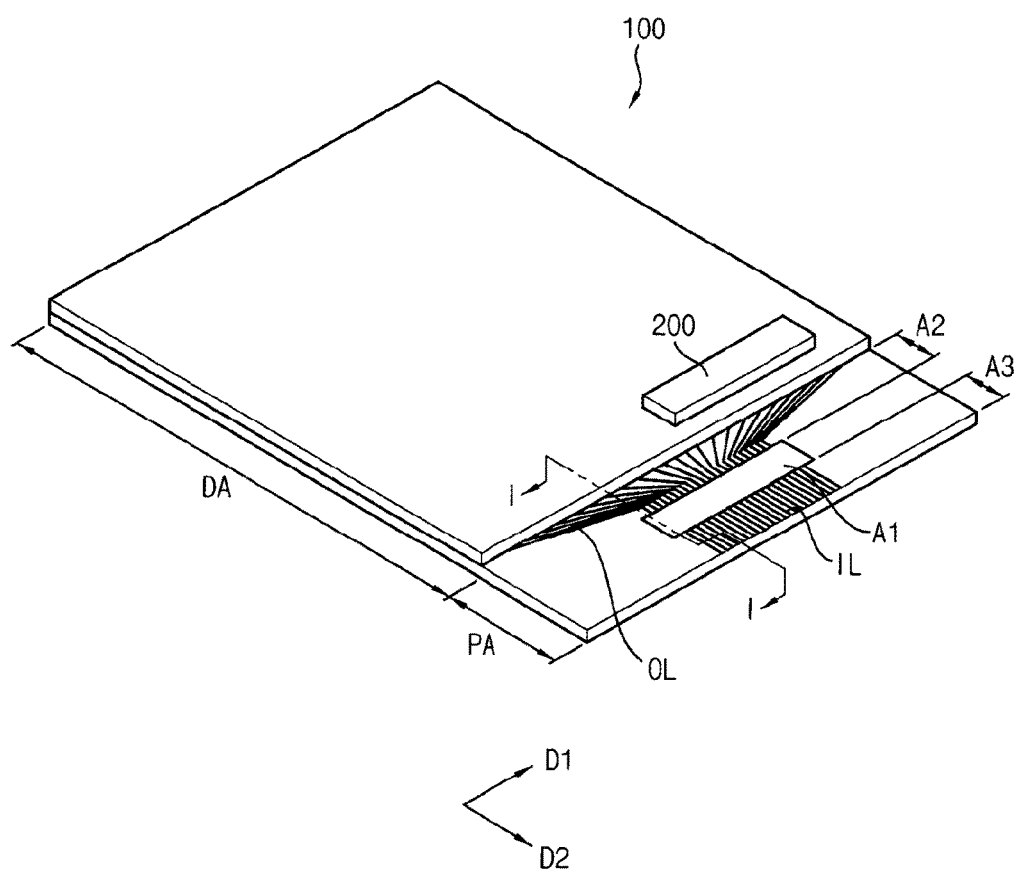
FIG. 1 is a perspective view illustrating a display panel according to an example embodiment of the inventive concept.

FIG. 1 is a perspective view illustrating a display panel according to an example embodiment of the inventive concept.

Referring to FIG. 1, a display panel 100 includes a display area DA and a peripheral area PA.

An image is displayed on the display area DA. A circuit wiring to display the image is formed in the display area DA. The peripheral area PA is adjacent to the display area DA in a first direction D1. The peripheral area PA includes a pad area A1, an output fan-out area A2 and an input area A3.

The pad area A1 is spaced apart from the display area DA, and extends in a second direction D2 which is substantially perpendicular to the first direction D1. A plurality of output pads and a plurality of input pads are disposed in the pad area A1. The output pads and the input pads are electrically connected to a driving chip 200. (refers to FIG. 2)

The output fan-out area A2 is disposed between the pad area A1 of the peripheral area PA and the display area DA. A plurality of output lines OL are disposed in the output fan-out area A2. The output lines OL electrically connect the circuit wiring of the display area DA to the output pads of the pad area A1 of the peripheral area PA. The output line OL receives an output signal form the driving chip 200, and transmits the output signal to the circuit wiring of the display area DA. A width of the output lines OL along the second direction D2 are expanded from the output pads to the display area DA (fan-out).

The input area A3 is adjacent to the pad area A1 of the peripheral area PA. The input area A3 is disposed opposite to the output fan-out area A2 with respect to the pad area A1. A plurality of input lines IL is disposed in the input area A3. The input line IL is electrically connected to the input line of the pad area A1. The input line IL receives an input signal from an additional driving part (refers to 60 of FIG. 16), and transmits the input signal to the input pad of the pad area A1.

The driving chip 200 is mounted on the pad area A1 of the peripheral area PA. The driving chip 200 processes signals for driving the circuit wiring to display an image on the display area DA. The driving chip 200 includes a plurality of output bumps and a plurality of input bumps which are disposed corresponding to the output pads and the input pads, respectively. An anisotropic conductive film is disposed between the driving chip 200 and the output and input pads. Thus, the anisotropic conductive film electrically connects the output pads to the output bumps, and electrically connects the input pads to the input bumps. Accordingly, the driving chip 200 receives the input signal through the input pads and processes the input signal, and then outputs the output signal such as a gate driving signal and a data driving signal through the output pads.

Figure 2:
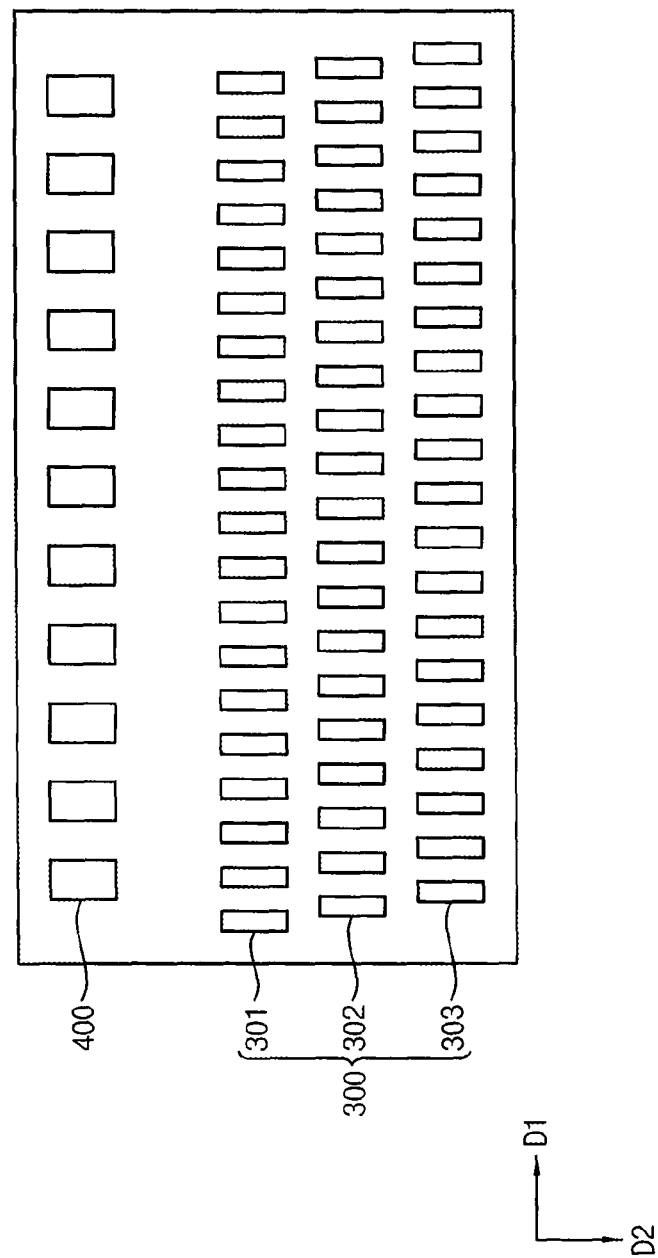
FIG. 2 is a plan view illustrating a pad area of FIG. 1 to explain an arrangement of input and output pads.

FIG. 2 is a plan view illustrating a pad area of FIG. 1 to explain an arrangement of input and output pads.

Referring to FIG. 2, a plurality of output pads 300 and a plurality of input pads 400 are disposed in a pad area of a display panel.

The output pads 300 include a first output pad 301, a second output pad 302 and a third output pad 303. The first output pad 301, the second output pad 302 and the third output pad 303 are arranged in a second direction D2 substantially perpendicular to a first direction D1. A plurality of output pads are arranged in the first direction D1 by a predetermined gap from the first output pad 301. A plurality of output pads are arranged in the first direction D1 by a predetermined gap from the second output pad 302. A plurality of output pads are arranged in the first direction D1 by a predetermined gap from the third output pad 303. Accordingly, the output pads 300 are arranged in a M*N matrix form. The figure shows when the M is 3.

The first output pad 301, the second output pad 302 and the third output pad 303 are spaced apart each other by a predetermined distance in the first direction D1. Thus, the first output pad 301, the second output pad 302 and the third output pad 303 are arranged along an inclined direction which is inclined by a predetermined angle with respect to the second direction D2.

When the driving chip (refers to 200 of FIG. 1) is mounted on the output pad, a resin of the anisotropic conductive film disposed between the driving chip and the output pad flows outside of the pad area. At this time, due to the incline arrangement of the output pad, the resin may easily flow. Thus, conductive balls of the anisotropic conductive film may be uniformly dispersed over the pad area, a contacting characteristic between output and input bumps of the driving chip (refers to 210 and 220 of FIG. 6), the output and input pads and the conductive balls may be improved.

The input pads 400 in the pad area are spaced apart from the output pads 300 in the second direction D2. The input pads 400 are arranged in the first direction D1.

Figure 3:
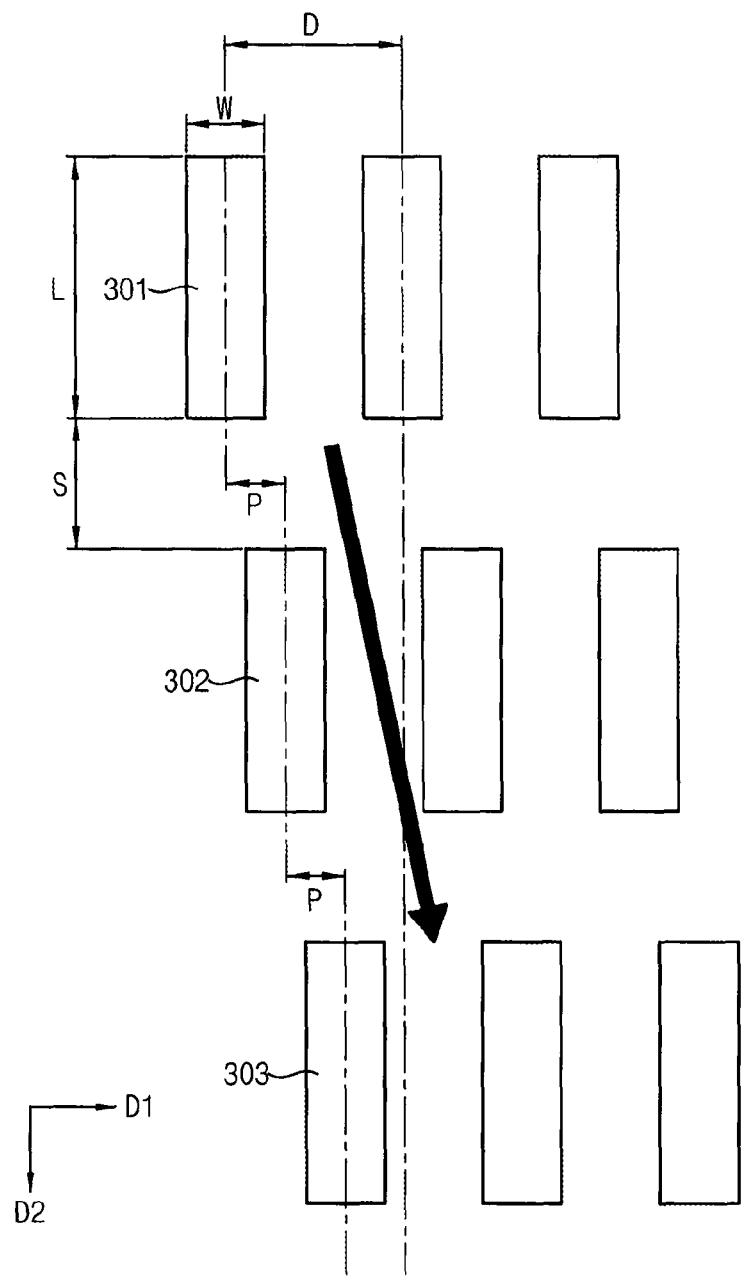
FIGS. 3, 4, 5 are plan views illustrating output pads of FIG. 2 according to various example embodiments of the inventive concept.
Figure 4:
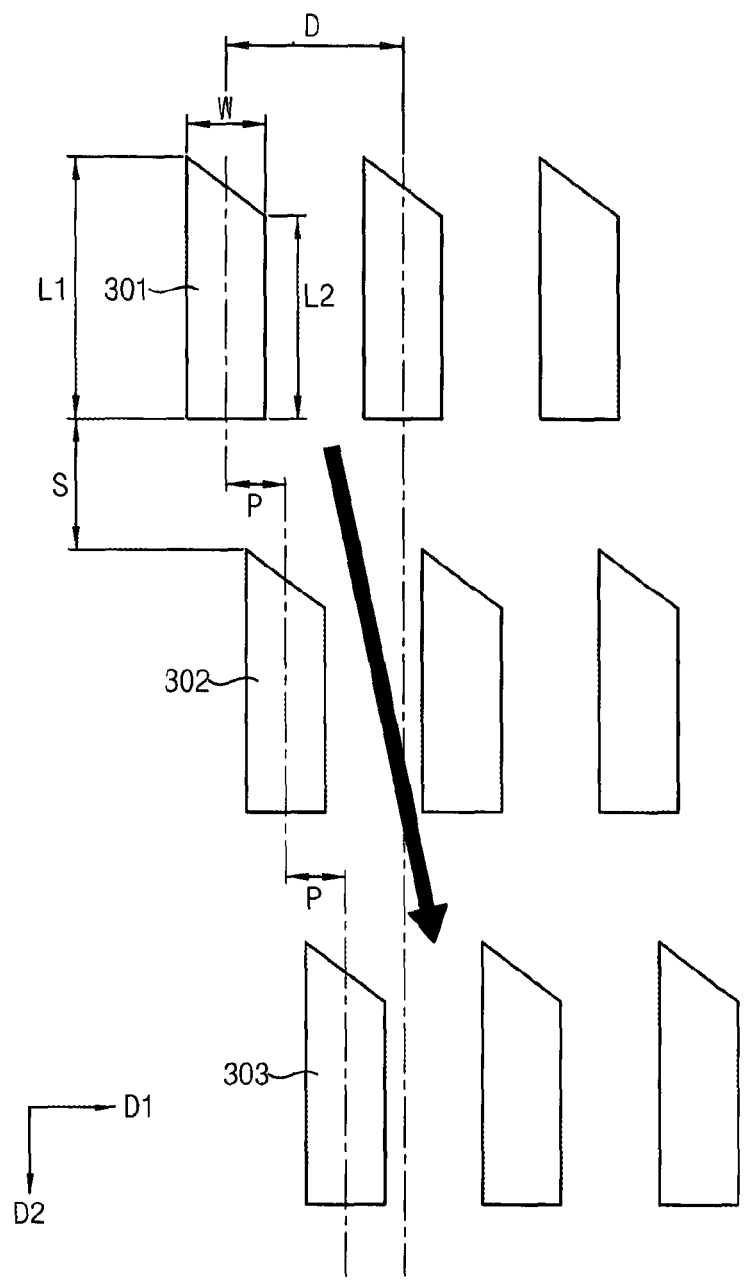
Figure 5:
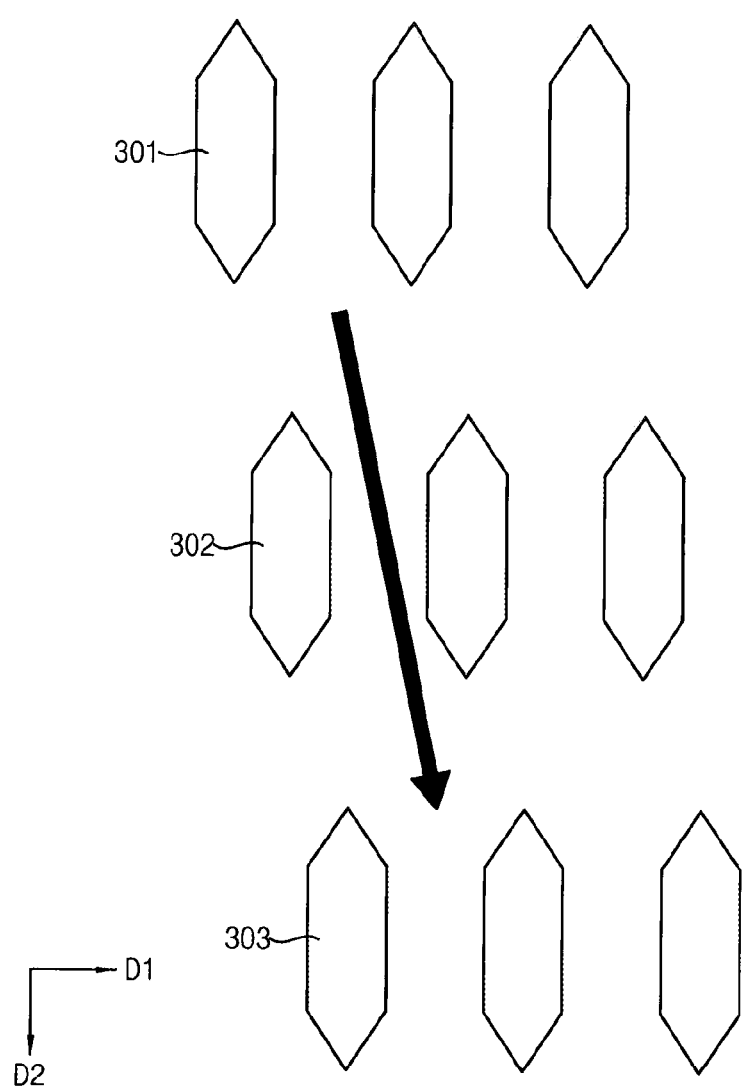

FIGS. 3 to 5 are plan views illustrating output pads of FIG. 2 according to various example embodiments of the inventive concept.

Referring to FIG. 3, output pads include a first output pad 301, a second output pad 302 and a third output pad 303. The first output pad 301, the second output pad 302 and the third output pad 303 are arranged in a second direction D2 substantially perpendicular to a first direction D1. A plurality of output pads are arranged in the first direction D1 by a predetermined gap from the first output pad 301. A plurality of output pads are arranged in the first direction D1 by a predetermined gap from the second output pad 302. A plurality of output pads are arranged in the first direction D1 by a predetermined gap from the third output pad 303. Accordingly, the output pads 300 are arranged in a M*N matrix form. The figure shows when the M is 3.

The first output pad 301 extends in the second direction D2, and has a length L. The first output pad 301 has a width W in the first direction D1. Each of the output pads has a shape substantially same as the first output pad 301.

A center of the first output pad 301 is spaced apart from a center of an output pad, which is adjacent to the first output pad 301 in the first direction D1, by a distance D. The first output pad 301 is spaced apart from the second output pad 302 in the second direction D2 by a gap S. The center of the first output pad 301 and a center of the second output pad 302 are spaced apart from each other in the first direction D1 by a pitch P. The third output pad 303 is spaced apart from the second output pad 302 in the second direction D2 by the gap S. The center of the second output pad 302 is spaced apart from a center of the third output pad 303 in the first direction D1 by the pitch P. Thus, the first output pad 301, the second output pad 302 and the third output pad 303 are arranged in a inclined direction with respect to the second direction D2.

The pitch P, the distance D and the row M meet an equation "P<D/(M−1)". For example, when the row M is 3, the pitch P may be D/3. Thus, the second output pad 302 and the third output pad 303 are disposed between the first output pad 301 and a output pad which is adjacent to the first output pad 301 in the first direction D1.

The width W, the length L, the distance D, the pitch P and the gap S may have various values according to an arrangement of the output pads. For example, when the row M is 3, the width W may be about 16 µm, the length L may be about 57 µm, the distance D may be about 33 µm, the pitch P may be about 11 µm, and the gap S may be about 39 µm.

In the present example embodiment, an output pad of second row and an output pad of third row are disposed between two output pads in the first row in the first direction D1, so that a resin of an anisotropic conductive film may easily flow in an arrow direction showed in the figures. Thus, conductive balls of the anisotropic conductive film may be uniformly dispersed over the pad area, a contacting characteristic between output and input bumps of the driving chip, the output and input pads and the conductive balls may be improved.

Referring to FIG. 4, output pads include a first output pad 301, a second output pad 302 and a third output pad 303. The first output pad 301, the second output pad 302 and the third output pad 303 are arranged in a second direction D2 substantially perpendicular to a first direction D1. A plurality of output pads are arranged in the first direction D1 by a predetermined gap from the first output pad 301. A plurality of output pads are arranged in the first direction D1 by a predetermined gap from the second output pad 302. A plurality of output pads are arranged in the first direction D1 by a predetermined gap from the third output pad 303. Accordingly, the output pads 300 are arranged in a M*N matrix form. The figure shows when the M is 3.

The first output pad 301 extends in the second direction D2. The first output pad 301 has a width W in the first direction D1, and has a first side having a first length L1 and a second side having a second length L2 in parallel with the first side. The first side extends in the second direction D2. The first length L1 is larger than the second length L2. Thus, the first output pad 301 has a trapezoidal shape. One side of the trapezoidal shape in a width direction is inclined.

A center of the first output pad 301 is spaced apart from a center of an output pad, which is adjacent to the first output pad 301 in the first direction D1, by a distance D. The first output pad 301 is spaced apart from the second output pad 302 in the second direction D2 by a gap S. The center of the first output pad 301 and a center of the second output pad 302 are spaced apart from each other in the first direction D1 by a pitch P. The third output pad 303 is spaced apart from the second output pad 302 in the second direction D2 by the gap S. The center of the second output pad 302 is spaced apart from a center of the third output pad 303 in the first direction D1 by the pitch P. Thus, the first output pad 301, the second output pad 302 and the third output pad 303 are arranged in a inclined direction with respect to the second direction D2.

The pitch P, the distance D and the row M meet an equation "P<D/(M−1)". For example, when the row M is 3, the pitch P may be D/3. Thus, the second output pad 302 and the third output pad 303 are disposed between the first output pad 301 and an output pad which is adjacent to the first output pad 301 in the first direction D1.

The width W, the first length L1, the second length L2, the distance D and the pitch P may have various values according to an arrangement of the output pads. For example, when the row M is 3, the width W may be about 16 μm, the first length L1 may be about 61 μm, the second length L2 may be about 53 μm, the distance D may be about 33 μm, and the pitch P may be about 11 μm.

The second side is disposed towards the second output pad 302 with respect to a center of the first output pad 301. Thus, the inclined side of the trapezoidal shape is inclined along a direction in which the first output pad 301, the second output pad 302 and the third output pad 303 are disposed. A resin of an anisotropic conductive film may flow in an arrow direction showed in the figures. At this time, the output pad has a trapezoidal shape, so that the resin of the anisotropic conductive film may easily flow.

Referring to FIG. 5, output pads are substantially same as output pads of FIG. 3, except for a shape of each of the output pads. Thus, any further detailed descriptions concerning the same elements will be briefly described or be omitted.

The output pads include a first output pad 301, a second output pad 302 and a third output pad 303. The first output pad 301, the second output pad 302 and the third output pad 303 are arranged in a second direction D2 substantially perpendicular to a first direction D1. A plurality of output pads are arranged in the first direction D1 by a predetermined gap from the first output pad 301. A plurality of output pads are arranged in the first direction D1 by a predetermined gap from the second output pad 302. A plurality of output pads are arranged in the first direction D1 by a predetermined gap from the third output pad 303. Accordingly, the output pads 300 are arranged in a M*N matrix form. The figure shows when the M is 3.

Each of the output pads has a hexagonal shape which has edges disposed at both ends in the second direction D2. A resin of an anisotropic conductive film may flow in an arrow direction showed in the figures. At this time, the output pad has a hexagonal shape, so that the resin of the anisotropic conductive film may easily flow.

Figure 6:
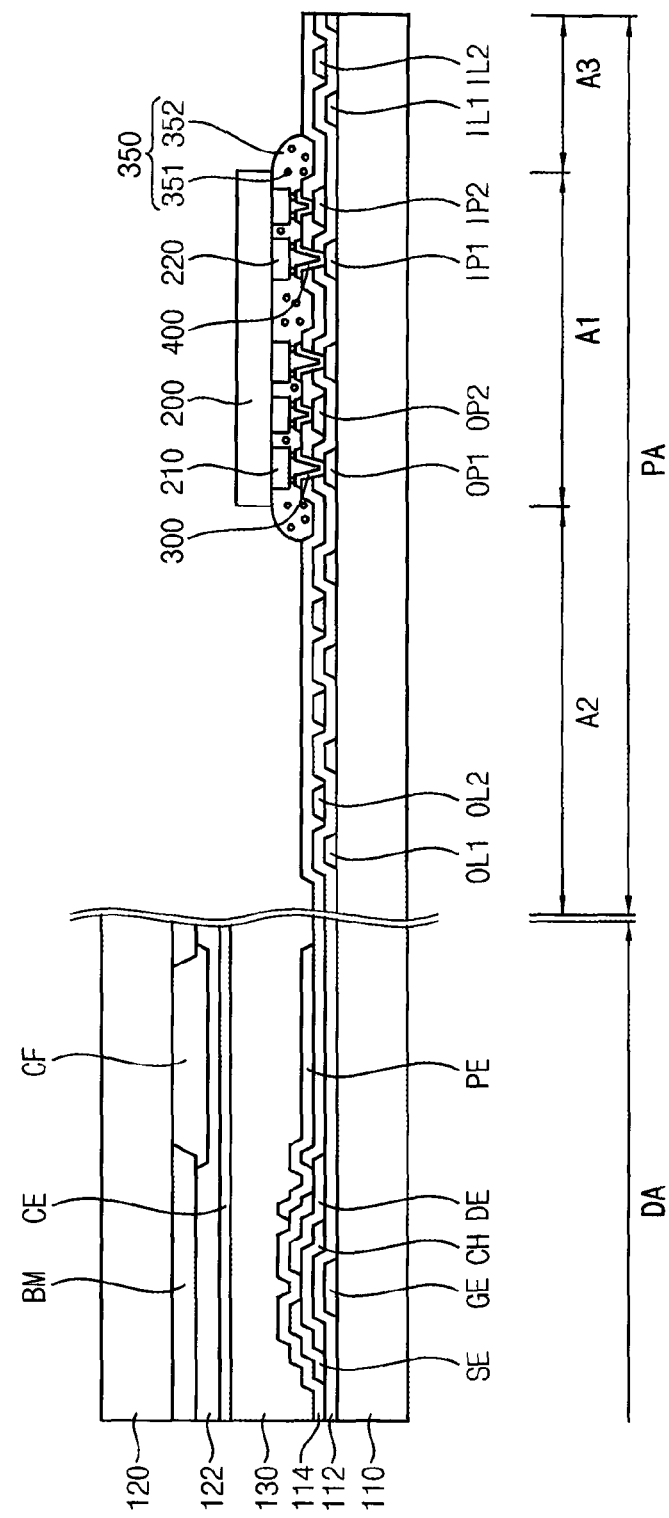
FIG. 6 is a cross-sectional view taken along a line I-I' of FIG. 1.

FIG. 6 is a cross-sectional view taken along a line I-I' of FIG. 1.

A display panel includes a display area DA and a peripheral area PA.

In the display area DA, the display panel includes a first substrate, a second substrate facing the first substrate, and a liquid crystal layer 130 disposed between the first substrate and the second substrate.

The first substrate includes a first base substrate 110, a gate electrode GE, a first insulation layer 112, a channel layer CH, a source electrode SE, a drain electrode DE, a second insulation layer 114 and a pixel electrode PE.

The first base substrate 110 may be a transparent insulation substrate made for example of glass and/or plastic.

The gate electrode GE is disposed on the first base substrate 110. The gate electrode GE is electrically connected to a gate line (not shown). The gate electrode GE may include a copper (Cu), copper oxide (CuOx), etc. In addition, the gate electrode GE may include gallium doped zinc oxide (GZO), indium doped zinc oxide (GZO), copper-manganese alloy (CuMn), etc.

The first insulation layer 112 is disposed on the first bases substrate 110 on which the gate line and the gate electrode GE is disposed. The first insulation layer 112 insulates the gate line and the gate electrode GE. The first insulation layer 112 may include silicon oxide (SiOx), silicon nitride (SiNx), etc.

The channel layer CH is disposed on the first insulation layer 110, and overlaps the gate electrode GE. The channel layer CH may include a semiconductor layer consisting of amorphous silicon (a-Si:H) and an ohmic contact layer consisting of n+ amorphous silicon (n+ a-Si:H). In addition, the channel layer CH may include an oxide semiconductor. The oxide semiconductor may include an amorphous oxide including at least one selected from the group consisting of indium (In), zinc (Zn), gallium (Ga), tin (Sn) and hafnium (Hf). More particularly, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the channel layer CH may include indium gallium zinc oxide (IGZO).

The source electrode SE is disposed on the channel layer CH, and is electrically connected to the data line (not shown) crossing the gate line. The source electrode SE may include a copper (Cu), copper oxide (CuOx), etc.

The drain electrode DE is disposed on the channel layer CH. The drain electrode DE is spaced apart from the source electrode SE. The drain electrode DE may include a copper (Cu), copper oxide (CuOx), etc.

The gate electrode GE, the channel layer CH, the source electrode SE and the drain electrode DE form a switching element.

The second insulation layer 114 is disposed on the first insulation layer 112 on which the switching element is formed. The second insulation layer 114 electrically insulates the switching element. The second insulation layer 114 may include silicon oxide (SiOx), silicon nitride (SiNx), etc.

The pixel electrode PE is disposed on the second insulation layer 114. The pixel electrode PE is electrically connected to the drain electrode DE through a contact hole which is formed through the second insulation layer 114 extending to and exposing the drain electrode DE. The pixel electrode PE may include a transparent conductive material, such as indium tin oxide (ITO), indium zinc oxide (IZO) and etc. In addition, the pixel electrode PE may include titanium (Ti) and/or molybdenum titanium (MoTi).

The second substrate includes a second base substrate 120, a black matrix BM, a color filter CF, an over coating layer 122 and a common electrode CE.

The second base substrate 120 may be a transparent insulation substrate made for example of glass and/or plastic.

The black matrix BM is disposed on the base substrate 120. The black matrix BM is disposed corresponding to a non-display area which is a rest area of a display area, and blocks light. Thus, the black matrix BM overlaps the switching element, the data line and the gate line. In the present example embodiment, although the black matrix BM overlaps the switching element, the data line and the gate line, the black matrix BM may be disposed at a proper position to block light.

The color filter CF is disposed on the black matrix BM and the second base substrate 120. The color filter CF supplies colors to the light passing through the liquid crystal layer 130. The color filter CF may include a red color filter, a green color filter and blue color filter. The color filter CF corresponds to a pixel area. The color filters adjacent to each other may have different colors. The color filter CF may be overlapped with adjacent color filter CF in a boundary of the pixel area. The color filter CF may be spaced apart from adjacent color filter CF in the boundary of the pixel area.

The over-coating layer 122 is disposed on the black matrix BM and the color filter CF. The over-coating layer 122 flattens the color filter CF, protects the color filter CF, and insulates the color filter CF. The over-coating layer 122 may include acrylic-epoxy material.

The common electrode CE is disposed on the over-coating layer 122. The common electrode CE may include a transparent conductive material, such as indium tin oxide (ITO), indium zinc oxide (IZO) and etc. In addition, the common electrode CE may include titanium (Ti) and/or molybdenum titanium (MoTi).

The liquid crystal layer 130 is disposed between the first substrate and the second substrate. The liquid crystal layer 130 includes liquid crystal molecules having optically anisotropic. The liquid crystal molecules are driven by electric field, so that light may pass through or be blocked by the liquid crystal layer 130 to display an image.

In the peripheral area PA, the display panel includes a first substrate. The first substrate includes a first base substrate 110, a first output line OL1, a first output pattern OP1, a first input pattern IP1, a first input line IL1, a first insulation layer 112, a second output line OL2, a second output pattern OP2, a second input pattern IP2, a second input line IL2, a second insulation layer 114, a plurality of output pads 300, a plurality of input pads 400, an anisotropic conductive film 350 and a driving chip 200.

The peripheral area PA includes a pad area A1, an output fan-out area A2 and an input area A3.

The first output line OL1, the first output pattern OP1, the first input pattern IP1 and the first input line IL1 are disposed on the first base substrate 110. The first output line OL1 is disposed in the output fan-out area A2. The first output pattern OP1 and the first input pattern IP1 are disposed in the pad area A1. The first input line IL1 is disposed in the input area A3.

Accordingly, the gate electrode GE, the gate line, the first output pattern OP1, the first input pattern IP1 and the first input line IL1 may be disposed at a same layer. For example, the gate electrode GE, the gate line, the first output pattern OP1, the first input pattern IP1 and the first input line IL1 may be formed from a same metal layer.

The second output line OL2, the second output pattern OP2, the second input pattern IP2, the second input line IL2 are disposed on the first insulation layer 112. The second output line OL2 is disposed in the output fan-out area A2. The second output pattern OP2 and the second input pattern IP2 are disposed in the pad area A1. The second input line IL2 is disposed in the input area A3.

Accordingly, the source and drain electrode SE and DE, the data line, the second output line OL2, the second output pattern OP2, the second input pattern IP2 and the second input line IL2 may be disposed at a same layer. For example, the source and drain electrode SE and DE, the data line, the second output line OL2, the second output pattern OP2, the second input pattern IP2 and the second input line IL2 may be formed from a same metal layer.

In a plan view, the first output line OL1 and the second output line OL2 are alternately disposed. Thus, a plurality of output lines may be efficiently arranged in a limited space.

In a plan view, the first output pattern OP1 and the second output pattern OP2 are alternately disposed. Thus, a plurality of output patterns may be efficiently arranged in a limited space. In addition, the first input pattern IP1 and the second input pattern IP2 are alternately disposed. Thus, a plurality of input patterns may be efficiently arranged in a limited space.

In a plan view, the first input line IL1 and the second input line IL2 are alternately disposed. Thus, a plurality of input patterns may be efficiently arranged in a limited space.

The output pads 300 and the input pads 400 are disposed on the second insulation layer 114. A plurality of contact holes are formed through the second insulation layer 114 or through the first and second insulation layers 112 and 114. Each of the contact holes extends to and exposes the first output pattern OP1, the second output pattern OP2, the first input pattern IP1 or the second input pattern IP2. Each of the output pads 300 is electrically connected to the first output pattern OP1 or the second output pattern OP2 through the contact hole. Each of the input pads 400 is electrically connected to the first input pattern IP1 or the second input pattern IP2 through the contact hole.

Accordingly, the pixel electrode PE, the output pads 300 and the input pads 400 are formed from a same transparent conductive layer, so that the pixel electrode PE, the output pads 300 and the input pads 400 are disposed at a same layer.

The driving chip 200 includes a plurality of output bumps 210 and input bumps 220, which are disposed corresponding to the output pads 300 and the input pads 400, respectively.

The anisotropic conductive film 350 is disposed between the output and input bumps 210 and 220 of the driving chip 200 and the output and input pads 300 and 400. The anisotropic conductive film 350 includes conductive balls 351 and resin 352. The conductive balls 351 electrically connect the output and input bumps 210 and 220 of the driving chip 200 and the output and input pads 300 and 400. The resin 352 fixes the driving chip 200 on the display panel.

Figure 7:
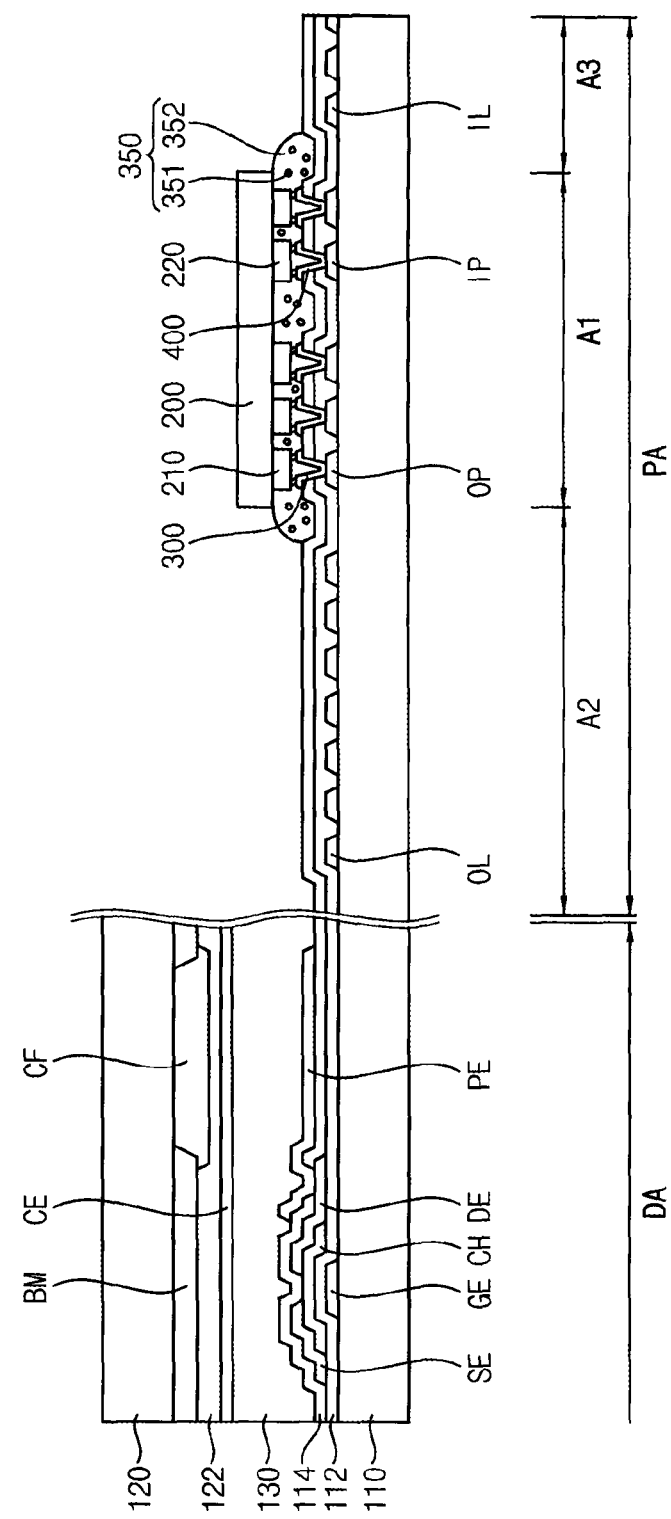
FIG. 7 is a cross-sectional view illustrating a display panel according to an example embodiment of the inventive concept.

FIG. 7 is a cross-sectional view illustrating a display panel according to an example embodiment of the inventive concept.

Referring to FIG. 7, a display panel is substantially same as a display panel of FIG. 6, except for an output line OL, an output pattern OP, an input pattern IP and an input line IL. Thus, any further detailed descriptions concerning the same elements will be briefly described or be omitted.

The display panel includes a display area DA and a peripheral area PA.

In the display area DA, the display panel includes a first substrate, a second substrate facing the first substrate, and a liquid crystal layer 130 disposed between the first substrate and the second substrate.

The first substrate includes a first base substrate 110, a gate electrode GE, a first insulation layer 112, a channel layer CH, a source electrode SE, a drain electrode DE, a second insulation layer 114 and a pixel electrode PE. The second substrate includes a second base substrate 120, a black matrix BM, a color filter CF, an over coating layer 122 and a common electrode CE. The display area DA of the display panel is substantially same as a display area of a display panel of FIG. 6.

In the peripheral area PA, the display panel includes a first substrate. The first substrate includes a first base substrate 110, an output line OL, an output pattern OP, an input pattern IP, an input line IL, a first insulation layer 112, a second insulation layer 114, a plurality of output pads 300, a plurality of input pads 400, an anisotropic conductive film 350 and a driving chip 200.

The peripheral area PA includes a pad area A1, an output fan-out area A2 and an input area A3.

The output line OL, the output pattern OP, the input pattern IP and the input line IL are disposed on the first base substrate 110. The output line OL is disposed in the output fan-out area A2. The output pattern OP and the input pattern IP are disposed in the pad area A1. The input line IL is disposed in the input area A3.

Accordingly, the gate electrode GE, the gate line, the output line OL, the output pattern OP, the input pattern IP and the input line IL may be formed form a same metal layer, so that the gate electrode GE, the gate line, the output line OL, the output pattern OP, the input pattern IP and the input line IL may be disposed at a same layer.

Each of the output pads 300 is electrically connected to the output pattern OP through a contact hole formed through the first and second insulation layer 112 and 114. Each of the input pads 400 is electrically connected to the input pattern IP through a contact hole formed through the first and second insulation layer 112 and 114

Figure 8:
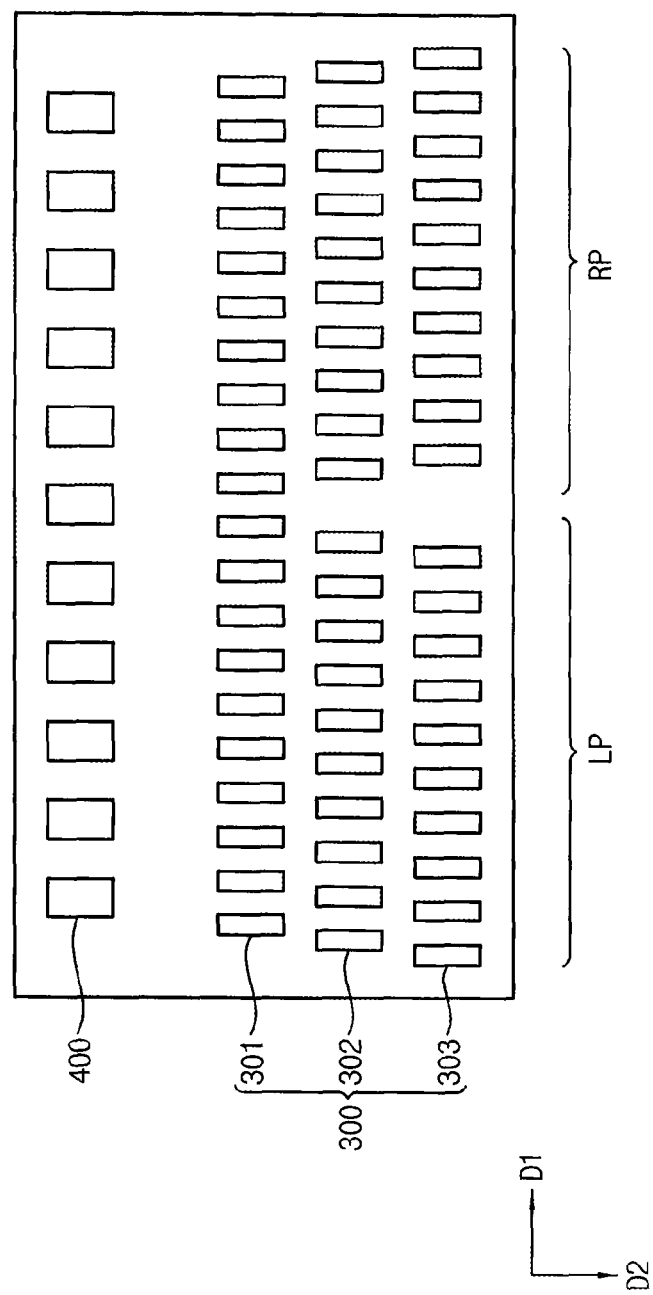
FIG. 8 is a plan view illustrating a pad area of a peripheral area of a display panel according to an example embodiment of the inventive concept to explain an arrangement of input and output pads.

FIG. 8 is a plan view illustrating a pad area of a peripheral area of a display panel according to an example embodiment of the inventive concept to explain an arrangement of input and output pads.

Referring to FIG. 8, in a pad area (refers to A1 of FIG. 1) of a display panel, a plurality of output pads 300 and a plurality of input pads 400 are disposed. The output pads 300 include a first output pad 301, a second output pad 302 and a third output pad 303.

The output pads 300 are disposed in bilateral symmetry with respect to a line which passes a center of the pad area and extends in a second direction D2.

Thus, the output pads 300 are obliquely disposed from first row to third row toward outside of the pad area in a left portion LP. The output pads 300 are disposed in symmetry to the left portion LP with respect to the line which passes the center of the pad area and extends in the second direction D2.

Accordingly, a resin of an anisotropic conductive film may easily flow from the center of the pad area to outside of the pad area.

Figure 9:
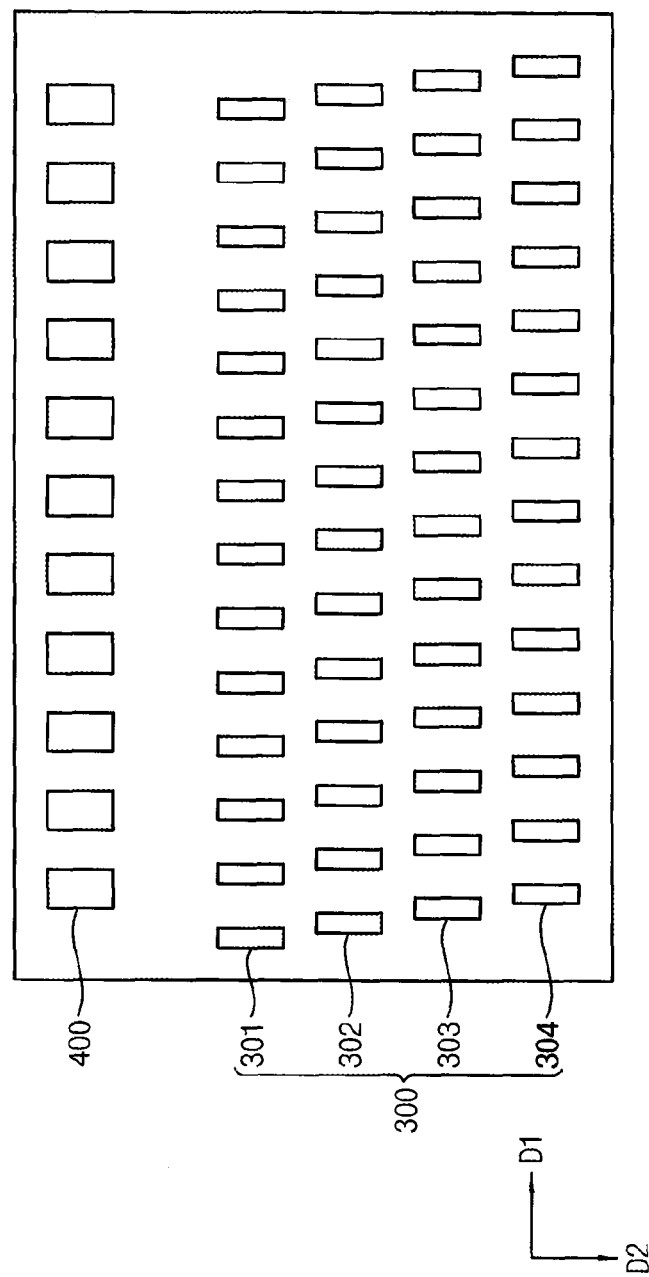
FIG. 9 is a plan view illustrating a pad area of a display panel according to an example embodiment of the inventive concept to explain an arrangement of input and output pads.

FIG. 9 is a plan view illustrating a pad area of a display panel according to an example embodiment of the inventive concept to explain an arrangement of input and output pads.

Referring to FIG. 9, in a pad area (refers to A1 of FIG. 1) of a display panel, a plurality of output pads 300 and a plurality of input pads 400 are disposed.

The output pads 300 include a first output pad 301, a second output pad 302, a third output pad 303 and a fourth output pad 304. The first output pad 301, the second output pad 302, the third output pad 303 and the fourth output pad 304 are arranged in a second direction D2 substantially perpendicular to a first direction D1. A plurality of output pads are arranged in the first direction D1 by a predetermined gap from the first output pad 301. A plurality of output pads are arranged in the first direction D1 by a predetermined gap from the second output pad 302. A plurality of output pads are arranged in the first direction D1 by a predetermined gap from the third output pad 303. A plurality of output pads are arranged in the first direction D1 by a predetermined gap from the fourth output pad 304. Accordingly, the output pads 300 are arranged in a M*N matrix form. The figure shows when the M is 4.

The first output pad 301, the second output pad 302, the third output pad 303 and the fourth output pad 304 are spaced apart each other by a predetermined distance in the first direction D1. Thus, the first output pad 301, the second output pad 302, the third output pad 303 and the fourth output pad 304 are arranged along an inclined direction which is inclined by a predetermined angle with respect to the second direction D2.

FIGS. 10A to 14 are plan views and cross-sectional views illustrating a method of manufacturing a display panel of FIG. 1.

Figure 10B:
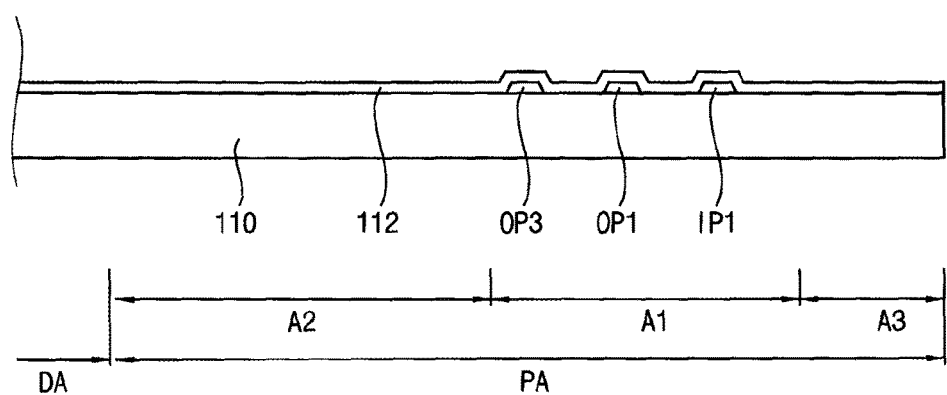

Referring to FIGS. 10A and 10B, a gate pattern is formed on a first base substrate 110. The gate pattern includes a first output pattern OP1, a third output pattern OP3 and a first input pattern IP1. The first base substrate 110 may be a transparent insulation substrate made for example of glass and/or plastic. The first output pattern OP1, the third output pattern OP3 and the first input pattern IP1 are disposed in a pad area A1 of a peripheral area PA adjacent to the display area DA.

For example, a gate metal layer is formed on the base substrate 110, and then the gate metal layer may be partially etched by a photolithography process or an etching process using an additional etching mask. Hence, the gate pattern including the first output pattern OP1, the third output pattern OP3 and the first input pattern IP1 are formed.

A first insulation layer 112 is formed on the base substrate 110 on which the gate pattern is formed. The first insulation layer 112 may be formed by a spin coating process, a printing process, a sputtering process, a CVD process, an ALD process, a PECVD process, an HDP-CVD process or a vacuum evaporation process in accordance with ingredients included in the first insulation layer 112.

The gate pattern may further include (2n–1)-th (n is a normal number) output patterns. (for example, OP5, OP9, OP11, etc.) The gate pattern may further include (2n–1)-th (n is a normal number) input patterns. (for example, IP3, etc.)

Figure 11B:
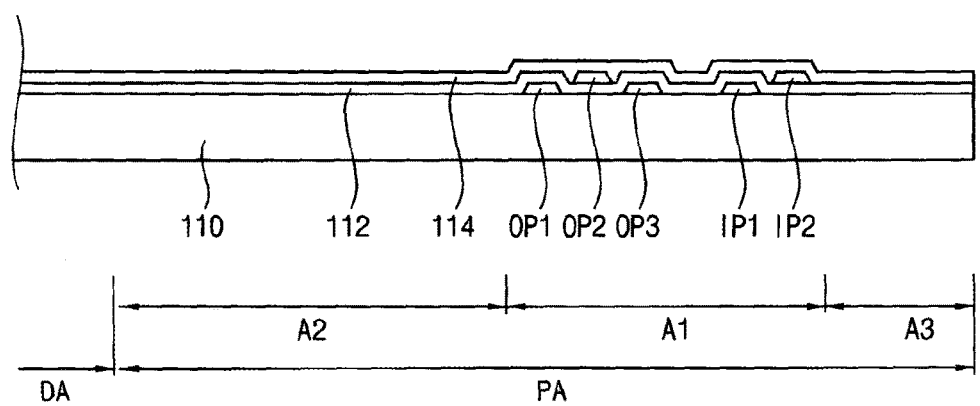
Figure 12B:
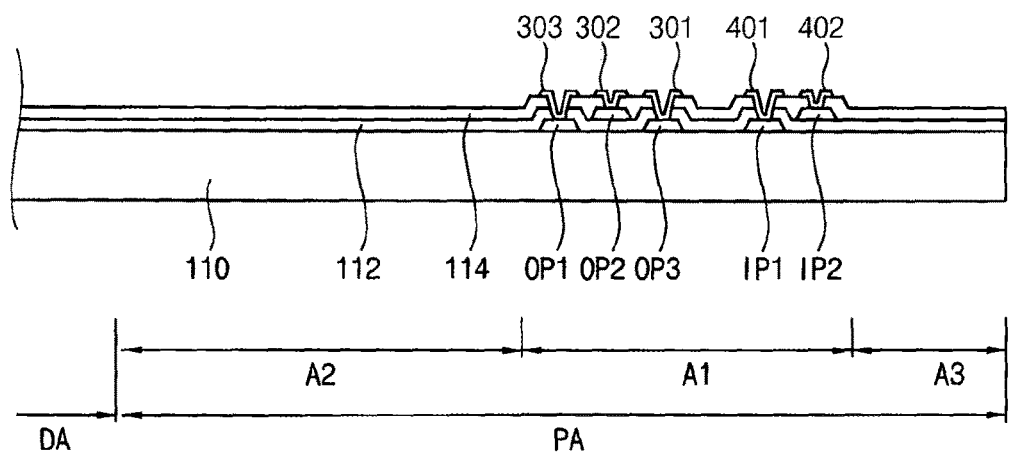

Referring to FIGS. 11A and 11B, a data pattern is formed on the first insulation layer 112. The data pattern includes a second output pattern OP2 and a second input pattern IP2. The second output pattern OP2 and the second input pattern IP2 are disposed in a pad area A1 of the peripheral area PA adjacent to the display area DA.

For example, a data metal layer is formed on the first insulation layer 112, and then the data metal layer may be partially etched by a photolithography process or an etching process using an additional etching mask. Hence, the data pattern including the second output pattern OP2 and the second input pattern IP2 are formed.

A second insulation layer 114 is formed on the first insulation layer 112 on which the data pattern is formed. The second insulation layer 114 may be formed by a spin coating process, a printing process, a sputtering process, a CVD process, an ALD process, a PECVD process, an HDP-CVD process or a vacuum evaporation process in accordance with ingredients included in the second insulation layer 114.

The data pattern may further include 2n-th (n is a normal number) output patterns. (for example, OP4, OP6, OP8, etc.) The data pattern may further include 2n-th (n is a normal number) input patterns. (for example, IP4, etc.)

Accordingly, the (2n−1)-th output pattern of the gate pattern and the 2n-th output pattern of the data pattern are alternately disposed in a plan view.

Referring to FIS. 12A and 12B, a plurality of contact holes CT are formed though the first and second insulation layer 112 and 114 or through the second insulation layer 114. Each of the contact holes CT extends to and exposes each of output patterns or input patterns.

A plurality of input pads and a plurality of output pads are formed on the second insulation layer 114 through which the contact holes CT are formed. The output and input pads are electrically connected to the output and input pattern through the contact hole CT.

For example, a transparent conductive layer is formed on the second insulation layer 114, and then the transparent conductive layer may be partially etched by a photolithography process or an etching process using an additional etching mask. Hence, the output and input pads are formed. The transparent conductive layer may include a transparent conductive material, such as indium tin oxide (ITO), indium zinc oxide (IZO) and etc. In addition, the transparent conductive layer may include titanium (Ti) and/or molybdenum titanium (MoTi).

Accordingly, a plurality of output pads 301, 302, 303, 304, 305, and 306 and a plurality of input pads 401, 402, 403 and 404 may be formed.

Figure 13:
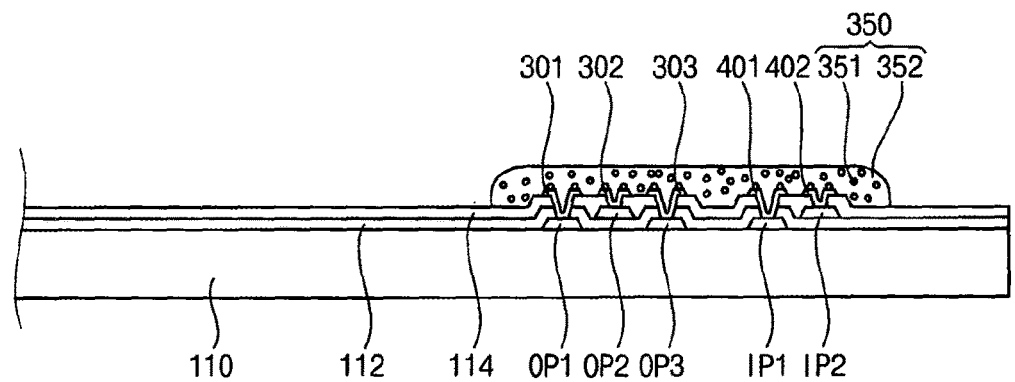

Referring to FIG. 13, an anisotropic conductive film 350 is formed on the output pads 301, 302, 303 and the input pads 401, 402. The anisotropic conductive film 350 includes conductive balls 351 and resin 352. The anisotropic conductive film 350 may be an adhesive-type, so that the anisotropic conductive film 350 may be coated between the output pads 301, 302, 303 and the input pads 401, 402. In addition, the anisotropic conductive film 350 may be an adhesive-film-type, so that the anisotropic conductive film 350 may be attached on the output pads 301, 302, 303 and the input pads 401, 402.

Figure 14:
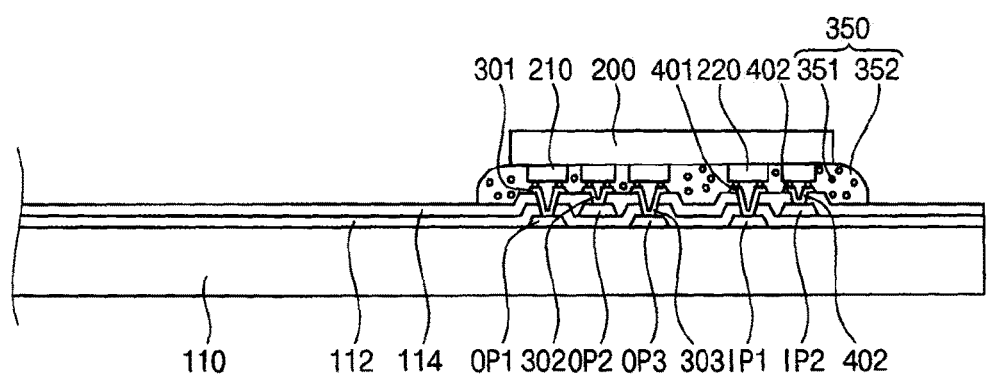

Referring to FIG. 14, a driving chip 200 is formed on the anisotropic conductive film 350. The driving chip 200 includes a plurality of output bumps 210 and input bumps 220, which are disposed corresponding to the output pads 300 and the input pads 400, respectively. The driving chip 200 may be disposed on the anisotropic conductive film 350, and then the driving chip 200 may be pressed toward the first base substrate 110 to mount the driving chip 200 on the display panel.

Figure 15A:
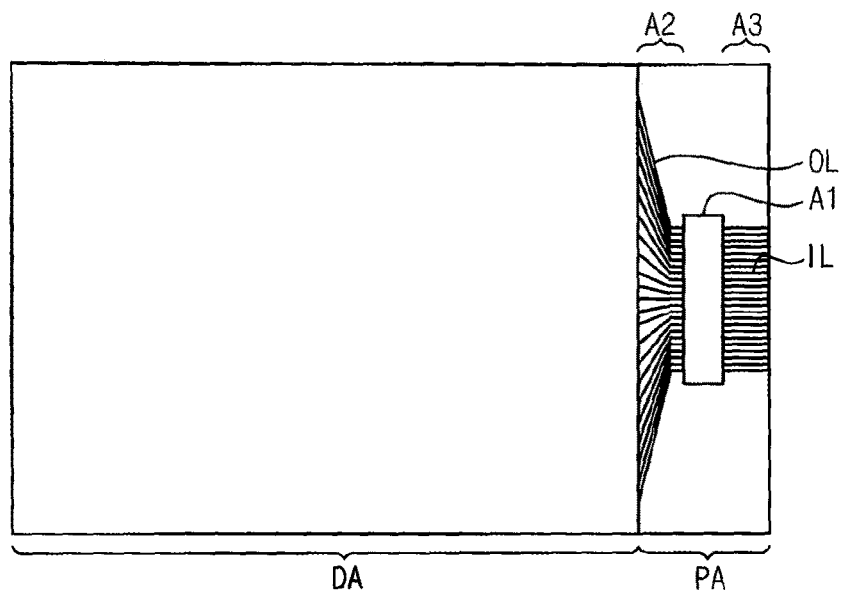
FIGS. 15A to 15B are a plan view and a cross-sectional view for additionally explaining a method of manufacturing a display panel.
Figure 15B:
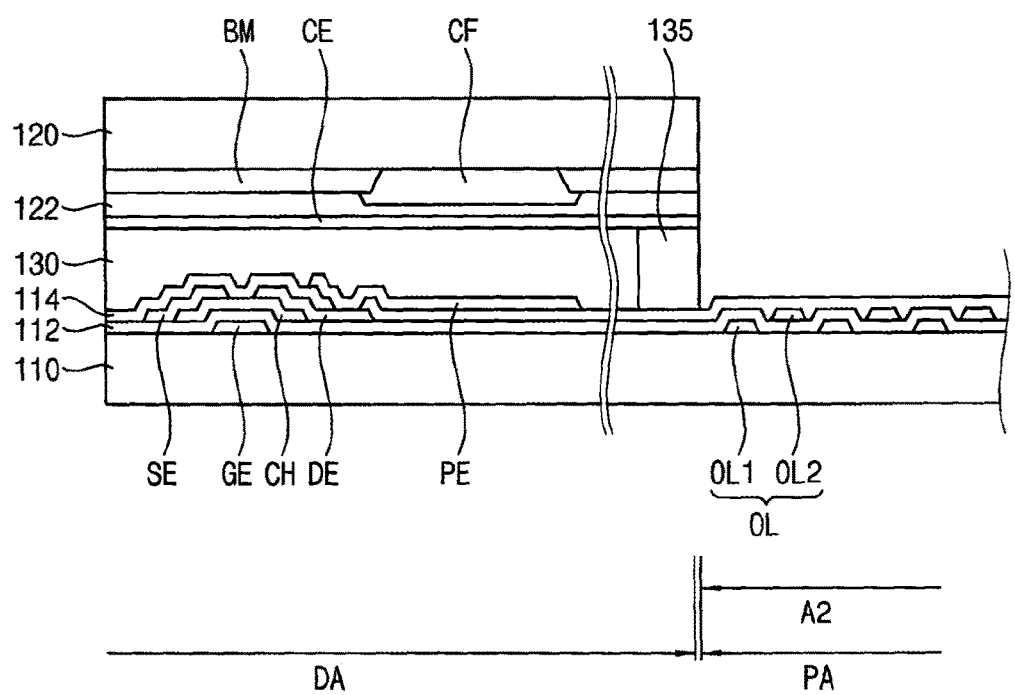

FIGS. 15A to 15B are a plan view and a cross-sectional view for additionally explaining a method of manufacturing a display panel.

Referring to FIGS. 15A and 15B, a display panel 100 includes a display area DA and a peripheral area PA.

An image is displayed in the display area DA. A circuit wiring to displaying the image is disposed in the display area DA. The peripheral area PA is disposed adjacent to the display area DA in a first direction D1. The peripheral area PA includes a pad area A1, an output fan-out area A2 and an input area A3.

In the display area DA, the display panel includes a first substrate, a second substrate facing the first substrate, and a liquid crystal layer 130 disposed between the first substrate and the second substrate.

The first substrate includes a first base substrate 110, a gate electrode GE, a first insulation layer 112, a channel layer CH, a source electrode SE, a drain electrode DE, a second insulation layer 114 and a pixel electrode PE. The second substrate includes a second base substrate 120, a black matrix BM, a color filter CF, an over-coating layer 122 and a common electrode CE. The liquid crystal layer 130 may be received between the first substrate and the second substrate by a sealant 135.

The output fan-out area A2 is disposed between the pad area A1 of the peripheral area PA and the display area DA. A plurality of output lines OL are disposed in the output fan-out area A2. The output lines OL electrically connect the circuit wiring of the display area DA to the output pads of the pad area A1 of the peripheral area PA. The output line OL receives an output signal form the driving chip 200, and transmits the output signal to the circuit wiring of the display area DA. A width of the output lines OL along the second direction D2 are expanded from the output pads to the display area DA (fan-out). The output line OL includes a first output line OL1 disposed between the first base substrate 110 and the first insulation layer 112, and a second output line OL2 disposed between the first insulation layer 112 and the second insulation layer 114.

The gate electrode GE and the first output line OL1 may be formed from a gate metal layer. (refers to FIG. 10B) The source electrode SE, the drain electrode DE, and the second output line OL2 may be formed form a data metal layer. (refers to FIG. 11B)

Thus, the output lines formed from the gate metal layer and the output lines formed form the data metal layer are alternately disposed in a plan view.

Figure 16:
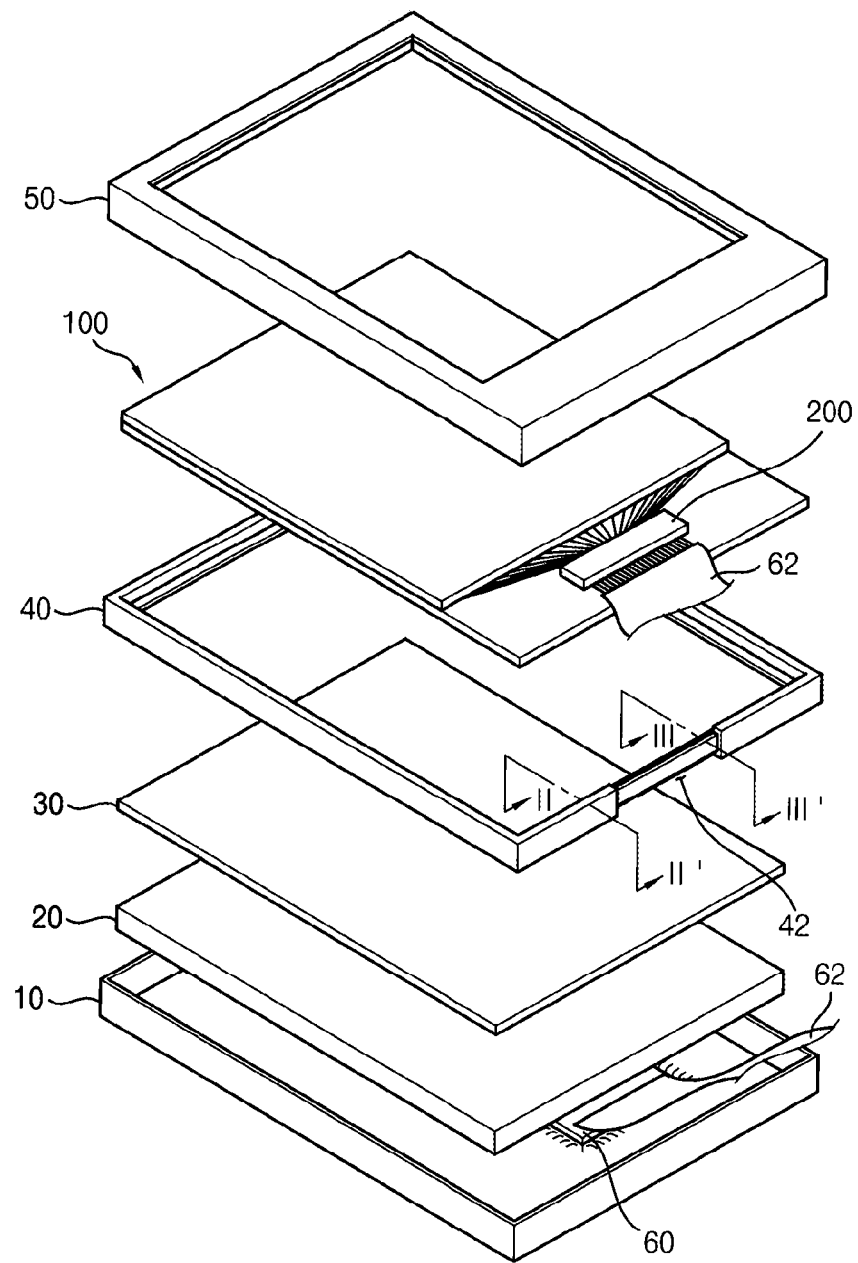
FIG. 16 is an exploded perspective view illustrating a display apparatus according to an example embodiment of the inventive concept.
Figure 17:
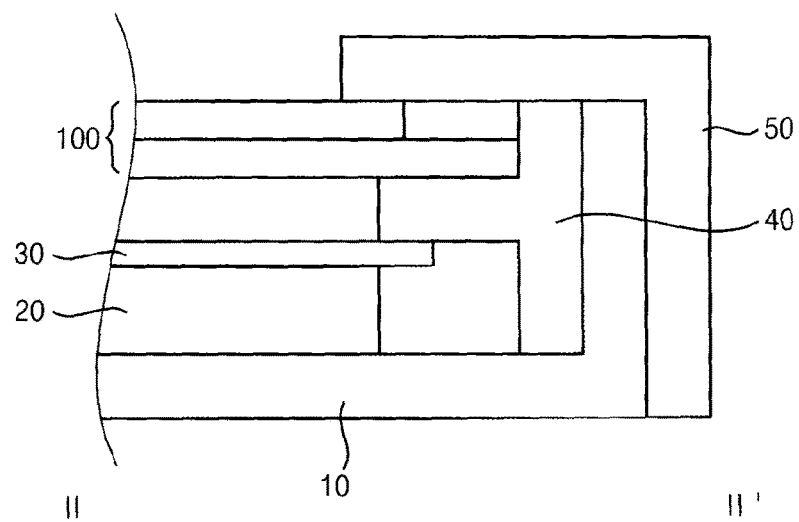
FIG. 17 is a cross-sectional view taken along a line II-II' of FIG. 16.
Figure 18:
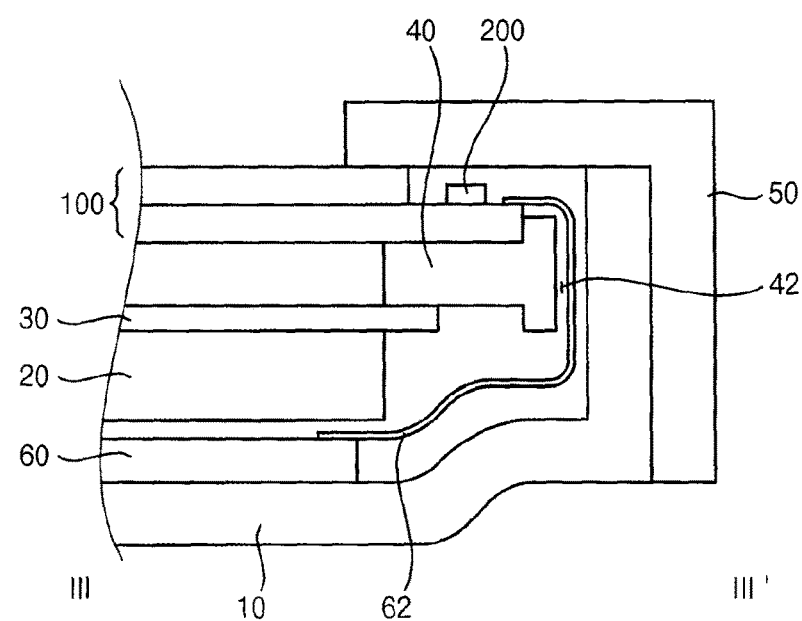
FIG. 18 is a cross-sectional view taken along a line III-III' of FIG. 16.

FIG. 16 is an exploded perspective view illustrating a display apparatus according to an example embodiment of the inventive concept. FIG. 17 is a cross-sectional view taken along a line II-II' of FIG. 16. FIG. 18 is a cross-sectional view taken along a line of FIG. 16.

Referring to FIGS. 16 and 17, a display apparatus includes a receiving container, a backlight assembly 20, an optical element 30, a mold frame 40, a display panel 100 and a driving part 60.

The receiving container includes a bottom chassis 10 and a top chassis 50. The receiving container receives the backlight assembly 20, the optical element 30, the mold frame 40, the display panel 100 and the driving part 60.

The display panel 100 includes a first substrate, a second substrate facing the first substrate, and a liquid crystal layer disposed between the first substrate and the second substrate. A driving chip 200 is mounted on the first substrate. The display panel 100 is substantially same as a display panel of FIG. 1. Thus, any further detailed descriptions concerning the same elements will be omitted.

The backlight assembly 20 is disposed under the display panel 100. The backlight assembly 20 generates light and provides the light to the display panel 100. The backlight assembly 20 may include a light guiding plate and a light source part. The light source part generates the light and provides the light to the light guiding plate. The light guiding plate is disposed adjacent to the light source part, and emits the light as a surface light toward the display panel 100.

The optical element 30 is disposed between the display panel 100 and the backlight assembly 20. The optical element 30 may improve optical property of the light from the backlight assembly 20. Thus, the optical element 30 may make brightness of the light from the backlight assembly 20 be uniform. The optical element 30 may include plurality of optical sheets. For example, optical element 30 may include a protecting sheet, a prism sheet and a diffusion sheet. In addition, many modifications of the optical sheet may be possible.

The mold frame 40 fixes the display panel 100, the optical element 30 and the backlight assembly 20 in the receiving container.

The driving part 60 may be disposed between the bottom chassis 10 and the backlight assembly 20. The driving part 60 is electrically connected to an input line of the display panel 100 (refers to IL of FIG. 1) through a connecting part 62. The driving part 60 may provide an input signal to the input line. The connecting part 62 may connect the display panel 100 to the driving part 60 through an opening 42 formed through the mold frame 40.

According to the present inventive concept, a display panel includes a pad area in which a plurality of output pads has a specific arrangement. Between adjacent two output pads in a first row, an output pad in other column and same row is disposed, so that a resin of an anisotropic conductive film may easily flow. Thus, conductive balls of the anisotropic conductive film may be uniformly dispersed over the pad area, so that a contacting characteristic between output and input bumps of a driving chip, the output and input pads and the conductive balls may be improved.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A method of manufacturing a display panel comprising:
   forming a circuit wiring and a plurality of output pads; and
   mounting a driving chip comprising output bumps on the output pads,
   wherein the output pads are arranged in a matrix formed having M row*N column, M and N are normal numbers, M is 3 or larger than 3, the M row extending in a first direction and the N column extending in a second direction which is substantially perpendicular to the first direction,
   each of the output pads has a center of the output pad spaced apart from a center of an adjacent output pad in the first direction by a distance D in the first direction, and each of the output pads is spaced apart from an adjacent output pad by a gap,
   each of the output pads has a center of the output pad spaced apart from a center of an adjacent output pad in the second direction by a pitch P in the first direction,
   each of the output pads extends in the second direction, and has a width in the first direction, and
   each of the output pads comprises a first side having a first length and a second side having a second length, the first side extending in the second direction, the second side is in parallel with the first side, and the second length is smaller than the first length, and
   an equation "$P<D/(M-1)$" is satisfied.

2. The method of claim 1, wherein mounting the driving chip comprises:
   providing an anisotropic conductive film on the output pads; and
   locating the driving chip on the anisotropic conductive film, and then pressing the driving chip to electrically connect the output bumps to the output pads.

3. The method of claim 2, wherein forming the circuit wiring and the output pads comprises:
   forming a gate pattern comprising a gate line, a gate electrode and a first output pattern;
   forming a first insulation layer on the gate pattern; and
   forming a pixel electrode and the output pads on the first insulation layer.

4. The method of claim 3, wherein forming the circuit wiring and the output pads further comprises:
   between forming the first insulation layer and forming the pixel electrode and the output pads,
   forming a data pattern on the first insulation layer, the data pattern comprising a data line, a source electrode and a drain electrode; and
   forming a second insulation layer on the data pattern.

5. The method of claim 3, wherein the first output pattern and a second output pattern are alternately disposed in the first direction.

* * * * *